(12) United States Patent
Takasu

(10) Patent No.: US 6,411,100 B1
(45) Date of Patent: Jun. 25, 2002

(54) APPARATUS FOR EVALUATING MAGNETORESISTIVE HEAD

(75) Inventor: Shinichi Takasu, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 09/645,656

(22) Filed: Aug. 24, 2000

(30) Foreign Application Priority Data

Aug. 31, 1999 (JP) ............................................ 11-245256

(51) Int. Cl.[7] .............................................. G01R 31/02
(52) U.S. Cl. ........................ 324/501; 324/534; 324/210
(58) Field of Search ................................ 324/752, 753, 324/404, 394, 121 R, 501, 529, 534, 210

(56) References Cited

U.S. PATENT DOCUMENTS

| 5,508,614 A |   | 4/1996 | Garfunkel et al. ........... 324/318 |
| 5,527,110 A | * | 6/1996 | Abraham et al. .............. 374/5 |
| 5,550,696 A | * | 8/1996 | Nguyen ....................... 360/135 |
| 5,706,080 A | * | 1/1998 | Pekin et al. .................. 356/72 |

* cited by examiner

*Primary Examiner*—Safet Metjahic
*Assistant Examiner*—Vincent Q. Nguyen
(74) *Attorney, Agent, or Firm*—Webb Ziesenheim Logsdon Orkin & Hanson, P.C.

(57) ABSTRACT

There is disclosed an apparatus for locating a defect on an MR head without destroying it, if such a defect is present. The MR head has a head element, write electrode terminals, read electrode terminals, and a head electrode connected with the head element. The apparatus has a power supply and an OBIC amplifier. The power supply is connected with one of the three electrodes. The OBIC amplifier is connected with another electrode. The apparatus further includes a laser that emits a laser beam to a region containing the head element. A reflection image based on the reflected beam from the illuminated region and an internal photoelectric effect image based on a signal produced by electrical carriers induced by the internal photoelectric effect are displayed in a superimposed manner on a color CRT. This permits an operator to know where a defect is present on the MR head, if such a defect is present.

9 Claims, 3 Drawing Sheets

LASER BEAM

APPARATUS FOR EVALUATING MAGNETORESISTIVE HEAD

BACKGROUND OF THE INVENTION

1. Field of the Invention

The present invention relates to an apparatus for evaluating an MR (magnetoresistive) head and, more particularly, to an evaluating apparatus for locating a defect within an MR head by using a radiating beam, if such a defect is present.

An MR head is incorporated in a magnetic disk drive that magnetically reads and writes signals to and from a floppy disk or the like. If foreign matter and/or any defect are present in the MR head, read and write operations for reading and writing signals to and from the floppy disk or the like are hampered.

Generally, an electrical tester is used to determine whether an MR head under test is acceptable or defective, as described, for example, in U.S. Pat. No. 5,508,614. However, it is impossible to know where a defect is present on the MR head, if any.

Accordingly, a conceivable method of locating a defect on an MR head is to use an emission method. That is, a voltage of a certain magnitude is applied across a sample, such as an MR head. An electrical current of a given amplitude is passed through the sample. Thus, a defect is made to emit light. The defect is detected, based on the emission.

In this emission method, however, a large electrical current is passed to cause the defect to emit light. Therefore, there is a danger of destruction of the MR head.

SUMMARY OF THE INVENTION

It is an object of the present invention to provide a novel apparatus for evaluating a sample, such as an MR head, by locating a defect on the sample without destroying it.

An evaluating apparatus, in accordance with the present invention, evaluates an MR head having a head element, a write electrode, and a read electrode. A head electrode is connected with the head element. The evaluating apparatus comprises a voltage source, a signal detection system, and a radiating beam source. The voltage source is connected with one of the electrodes. The signal detection system includes an amplifier connected with another electrode. The radiating beam source directs a radiating beam to a region including the head element, thus producing an internal photoelectric effect. A signal produced by exciting electrical carriers by the internal photoelectric effect is detected. In this way, a defect on the MR head is detected, if any.

Another evaluating apparatus, in accordance with the present invention, evaluates an MR head having a head element, a write electrode, and a read electrode. A head electrode is connected with the head element. The evaluating apparatus comprises a voltage source, a signal detection system, and a radiating beam source. The voltage source is connected with one of the electrodes. The signal detection system includes an amplifier connected with another electrode. The radiating beam source directs a radiating beam to a region including the head element, thus producing a reflected beam from the region. A reflection image based on the reflected beam from the region and an internal photoelectric effect image based on a signal owing to electrical carriers induced by an internal photoelectric effect are displayed on a display unit in a superimposed manner. This permits a human operator to find a defect on the MR head, if any.

Other objects and features of the invention will appear in the course of the description thereof, which follows.

DESCRIPTION OF THE PREFERRED EMBODIMENT

Figure 1:
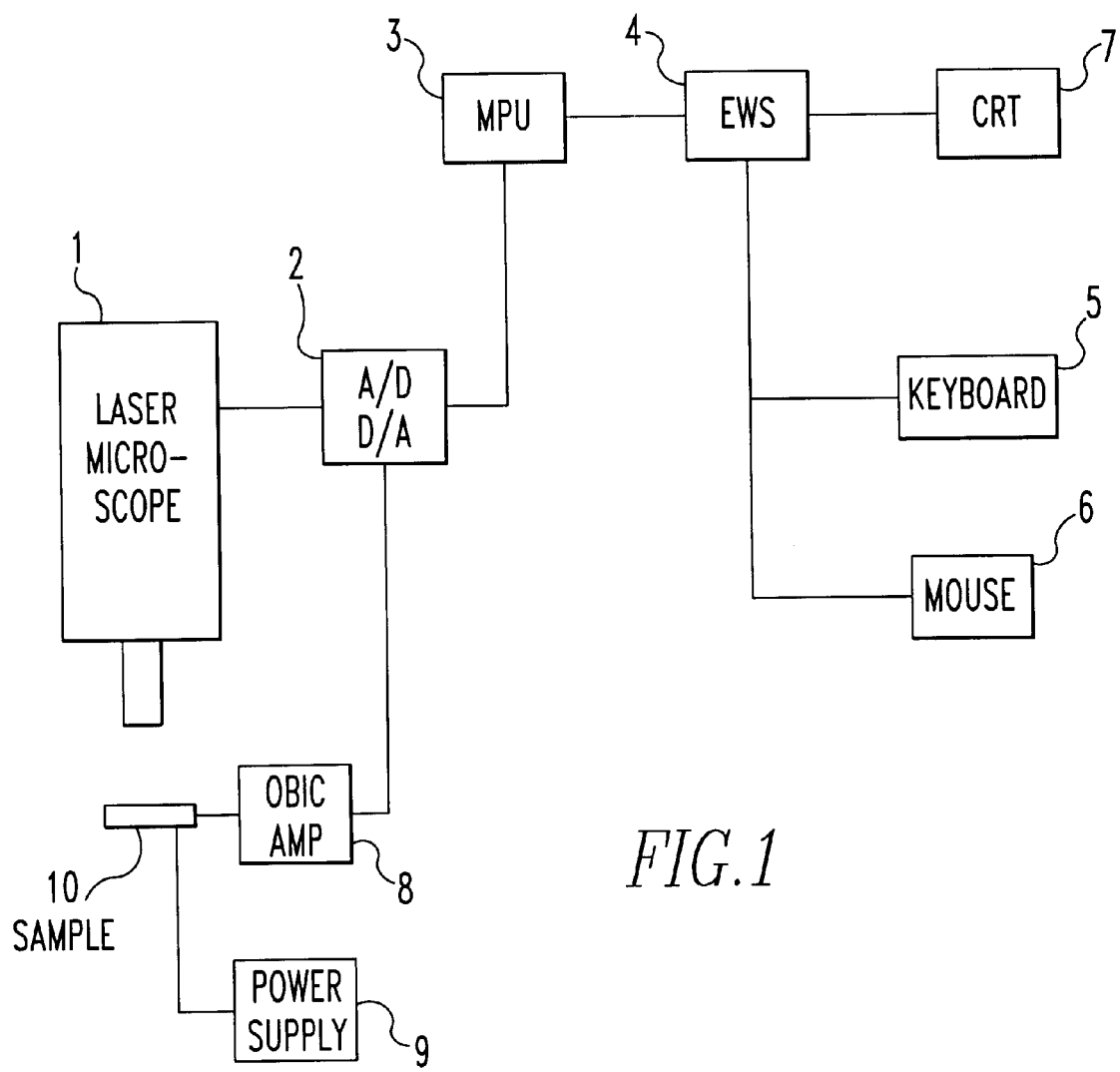
FIG. 1 is a block diagram of an apparatus built in accordance with the present invention to evaluate an MR head.

Referring to FIG. 1, an MR head-evaluating apparatus, in accordance with the present invention, is schematically shown. This apparatus comprises a scanning laser microscope system incorporating an OBIC (optical beam-induced current) apparatus.

The scanning laser microscope system comprises a microscope 1, an A/D and D/A converter board 2, a microprocessor unit (MPU) 3, and engineering workstation (EWS) 4, a keyboard 5, a mouse 6, and a color CRT 7. The OBIC apparatus comprises an OBIC amplifier 8 and a power supply 9. Indicated by 10 is a sample, such as an MR head.

The microscope 1 comprises a laser light source, an objective lens for focusing the laser beam emitted from the laser light source onto the sample 10, and a two-dimensional laser scanning mechanism consisting of, for example, an acousto-optic deflector for scanning the laser beam across the sample 10 horizontally and vertically. The microscope further includes an optical detector (not shown) for detecting light reflected from the sample 10 and an amplifier (not shown) for amplifying the output signal from the optical detector.

The OBIC amplifier 8 accepts the electrical carriers flowing through the sample 10 as an electrical current, converts the current into a voltage, amplifies the voltage, and sends the voltage to the A/D and D/A converter board 2.

This A/D and D/A converter board 2 has an A/D converter that receives data about the intensity of reflected light from the microscope 1 in synchronism with the horizontal and vertical scanning. The A/D converter also receives the output current signal from the OBIC amplifier 8 that indicates an internal photoelectric effect. The A/D converter converts the incoming data into digital form and sends it to the EWS 4 via the MPU 3.

The MPU 3 performs various control operations on the microscope 1 in response to various control signals sent from the EWS 4, for example, to turn on or off the laser light source, to control the horizontal and vertical scanning of the laser scanning mechanism, to control the movement of the sample stage, and to control the focusing of the objective lens. The D/A converter in the A/D and D/A converter board 2 converts the various control signals from the MPU 3 into analog signals and sends them to the microscope 1.

The EWS 4 routes the data coming from the MPU 3 to the color CRT 7, processes the data by various image-processing methods, and makes decisions as to the signals applied from the keyboard 5 and from the mouse 6.

Figure 2A:
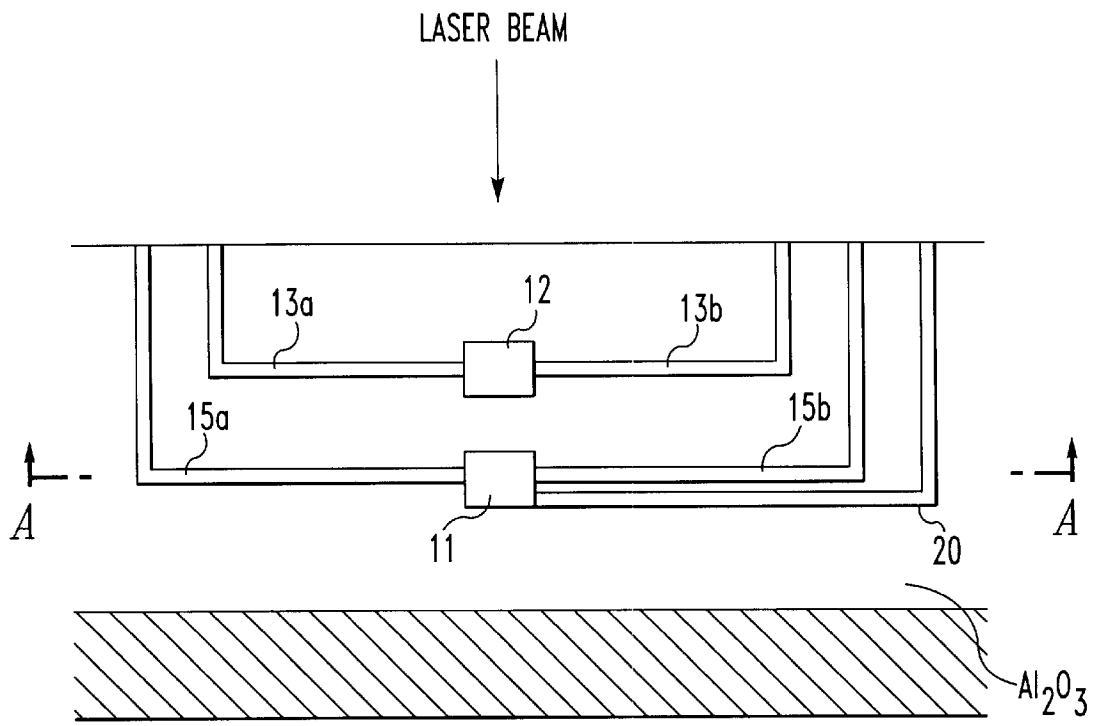
FIG. 2(a) is a schematic vertical cross section of an MR head evaluated by the apparatus shown in FIG. 1.
Figure 2B:
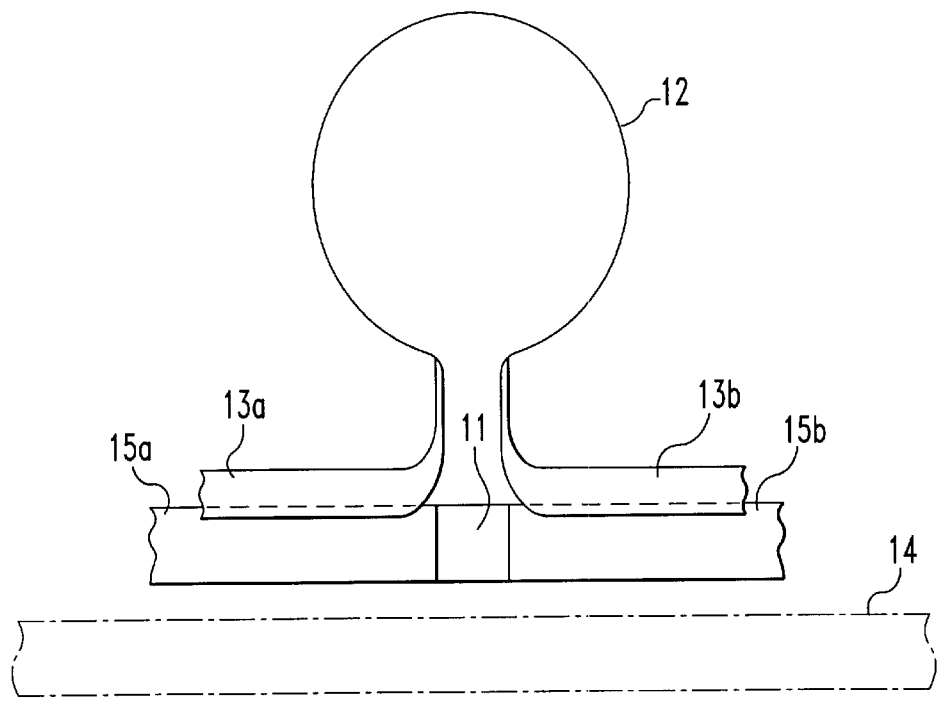
FIG. 2(b) is a cross-sectional view taken on line A—A of FIG. 2(a)

The operation of the MR head-evaluating apparatus constructed in this way is described below. FIG. 2(a) schematically shows an MR head. FIG. 2(b) is a cross-sectional view taken on line A—A of FIG. 2(a). A coil 12 is connected with a head element 11. Write electrode terminals 13a, 13b are used to magnetically record a signal on a recording medium 14, such as a floppy disk. Read electrode terminals 15a, 15b are used to read a signal from the recording medium. These parts, head element 11, write electrode terminals 13a, 13b, and read electrode terminals 15a, 15b, are spaced from each other within an alumina layer. Head electrode terminal 20 is connected to the head element 11. A gap is left between the head element 11 and the write electrode terminals 13a, 13b to permit magnetic transfer of signals between them. Also, a gap is formed between the head element 11 and the read electrode terminals 15a, 15b to enable magnetic transfer of signals between them. The whole alumina layer in which the head element 11, write electrode terminals 13a, 13b, and read electrode terminals 15a, 15b are arranged is formed on a ceramic substrate 16. Before the MR head is completed as a commercial product, a head electrode 20 is connected with the head element 11 via lead wires.

First, the power supply 9 is connected with the write electrode terminals 13a, 13b, and the OBIC amplifier 8 is connected with the read electrode terminals 15a, 15b, thus forming a closed circuit including the write electrode terminals and the read electrode terminals. Alternatively, the OBIC amplifier 8 may be connected with the write electrode terminals 13a, 13b, and the power supply 9 may be connected with the read electrode terminals 15a, 15b.

Under this condition, the laser light source of the microscope 1 is operated to emit. A laser producing a wavelength (roughly shorter than 1200 nm) capable of producing a current by OBIC is used as the laser light source. Although the power supply 9 is connected with the write electrode terminals 13a, 13b of the MR head, the output voltage from the power supply 9 is set to 0 V.

The aforementioned laser light source is operated to emit laser light having a wavelength of 1083 nm, for example. This laser light is directed to a region where the head element 11 is present. At this time, the laser light beam is focused onto the region where the head element 11 is present by the objective lens (not shown). At the same time, the laser light is scanned across a desired range containing the head by the laser scanning mechanism (not shown).

The laser light source is adjusted to maximize the light amount of the laser beam. The irradiation of the laser beam is performed for about 1 minute, for example. If a defect, such as foreign matter, is present in the alumina layer within the closed circuit including the write electrode terminals 13a, 13b and the read electrode terminals 15a, 15b, electrical carriers are produced in this portion by the internal photoelectric effect. At this time, the gain of the OBIC amplifier 8 is made as large as possible.

The OBIC amplifier 8 accepts the electrical current generated by the produced electrical carriers, converts the current into a voltage, amplifies it, and sends it to the A/D and D/A converter board 2. The data is image data based on the internal photoelectric effect and is sent via the MPU 3 to the EWS 4 having a frame memory. The image data routed from the MPU 3 and based on the internal photoelectric effect is stored in the frame memory of the EWS 4 together with corresponding scanned positions. At the same time, the image data based on the internal photoelectric effect is sent to the color CRT 7. As a result, an image based on the internal photoelectric effect is displayed on the viewing screen of the color CRT 7.

The light reflected from the region containing the head element 11 during the aforementioned scanning is received by the optical detector (not shown). The output from the optical detector indicative of the amplitude of the reflected light is amplified by the amplifier (not shown) and sent to the A/D and D/A converter board 2, where the A/D converter receives the incoming data about the amplitude of the reflected light in synchronism with the horizontal and vertical scanning and converts the incoming data about the amplitude of the reflected light into digital image data. The image data is sent to the EWS 4 via the MPU 3. The EWS 4 stores the image data coming from the MPU 3 in the internal frame memory along with corresponding scanned positions. Concurrently, the image data is supplied to the color CRT 7. In consequence, an image based on the reflected light is displayed on the viewing screen of the color CRT 7.

Figure 3:
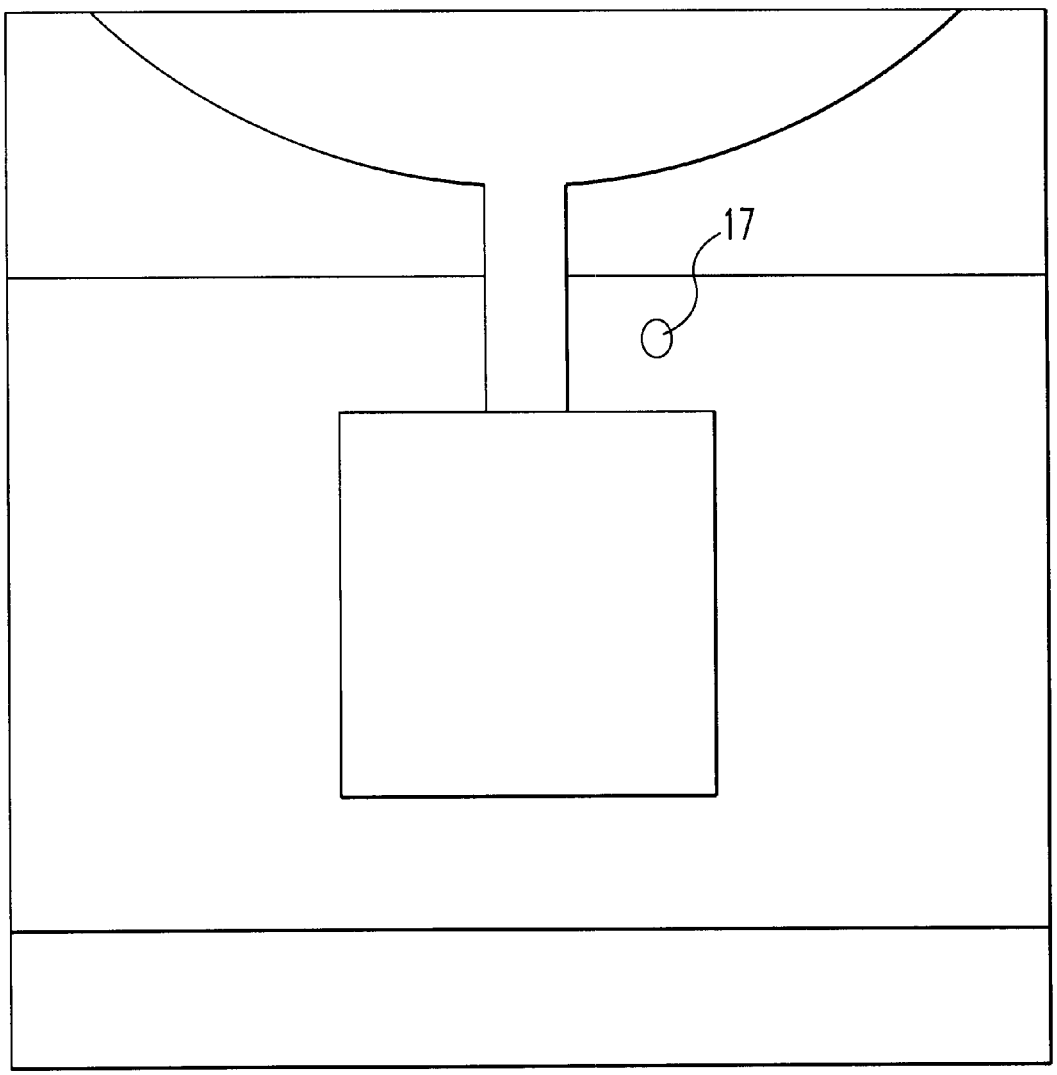
FIG. 3 is a view illustrating the manner in which a reflection light image and an internal photoelectric effect image indicating a defect are displayed in a superimposed manner in accordance with the present invention.

Accordingly, as shown in FIG. 3, an image based on the reflected light and an image 17 based on the internal photoelectric effect can be displayed on the viewing screen of the color CRT 7 in a superimposed manner. Consequently, the operator can know the portion of the MR head from which the image 17 based on the internal photoelectric effect originates. In this way, a defect can be located.

Where the image 17 based on the internal photoelectric effect is not displayed even if the amount of the laser light is almost maximized, the output voltage from the power supply 9 is set to such a value that the MR head is not destroyed, e.g., less than 1 volt.

Owing to the setup described above, a defect on the sample, or the MR head, can be located without destroying it, if such a defect is present.

Then, the power supply 9 is connected with the write electrode terminals 13a, 13b, and the head electrode 20 is connected with the OBIC amplifier 8, thus forming a closed circuit including the write electrode terminal and the head electrode. Alternatively, the OBIC amplifier 8 and the power supply 9 may be connected with the write electrode terminals 13a, 13b and the head electrode, respectively. Under this condition, a sequence of operations similar to the foregoing sequence of operations is carried out. At this time, if foreign matter or a defect is present in the alumina layer within the closed circuit including the write electrode terminals 13a, 13b and the head electrode 20, a thermal electromotive force is produced across this portion by the internal photoelectric effect. As a result, an image based on the reflected light and an image based on the internal photoelectric effect can be displayed in a superimposed manner on the color CRT 7. Hence, the operator can know where the defect is present on the sample.

Thereafter, the power supply 9 and the head electrode 20 are connected with the read electrode terminals 15a, 15b and the OBIC amplifier 8, respectively, thus forming a closed circuit including the read electrode terminals 15a, 15b and head electrode 20. Alternatively, the OBIC amplifier 8 and the power supply 9 may be connected with the read electrode terminals 15a, 15b and the head electrode, respectively. Under this condition, a sequence of operations similar to the above-described sequence of operations is carried out. If a defect, such as foreign matter, is present in the alumina layer within the closed circuit including the read electrode terminals 15a, 15b and the head electrode 20, a thermal electromotive force is produced across this portion by the internal photoelectric effect. As a result, an image based on the reflected light and an image based on the internal photoelectric effect can be displayed in a superimposed manner on the color CRT 7. It is possible to know where the defect is present on the sample.

Where the wavelength of the laser beam emitted by the laser light source is so long (e.g., longer than approximately 1200 nm, such as 1360 nm) that no OBIC phenomenon takes place, the output power of the laser light source is adjusted to approximately 0.05 mW to restrict the amount of light. If any image based on the internal photoelectric effect is not displayed when the desired region is illuminated with the aforementioned wavelength of laser beam, the output power of the laser light source is so adjusted as to increase the amount of light, or the output voltage of the power supply 9 is set to a voltage (e.g., less than 1 volt) that is low enough that the MR head is not destroyed.

In the embodiment described above, the laser beam is made to hit the top surface (front surface) of the sample from above. Instead, the laser beam may be made to hit the bottom surface (rear surface) of the sample from below.

Furthermore, in the embodiment described above, the laser beam that is focused is scanned across the sample. Instead, the laser beam that is not focused may be scanned across a desired region on the sample.

In addition, in the embodiment described above, a laser beam is made to impinge on the sample. Instead, an electron beam, an ion beam, or other radiating beam may be used.

Having thus described my invention with the detail and particularity required by the Patent Laws, what is desired protected by Letters Patent is set forth in the following claims.

What is claimed is:

1. An apparatus for evaluating an MR head having a head element, write electrodes, read electrodes, and a head electrode connected with the head element, said apparatus comprising:

a voltage source connected with one of the write electrodes or the read electrodes, and the head electrode of the MR head;

a signal detection system having an amplifier connected with another of the write electrodes or the read electrodes, and the head electrode of the MR head;

a radiating beam source for directing a radiating beam to a region containing said head element to induce electrical carriers in this region by an internal photoelectric effect, thus producing a signal; and said signal detection system acting to detect said signal, whereby detecting a defect on the MR head, if any.

2. An apparatus for evaluating an MR head having a head element, write electrodes, read electrodes, and a head electrode connected with the head element, said apparatus comprising:

a voltage source connected with one of the write electrodes or the read electrodes, and the head electrode of the MR head;

a signal detection system having an amplifier connected with another of the write electrodes or the read electrodes, and the head electrode of the MR head;

a radiating beam source for directing a radiating beam to a region containing said head element to produce a reflected beam from said region and to induce electrical carriers in this region by an internal photoelectric effect, thus producing a signal;

a first imaging means for producing a reflection image based on said reflected beam on a display unit; and a second imaging means for producing an internal photoelectric effect image based on said signal produced by the internal photoelectric effect on said display unit such that said reflection image and said internal photoelectric effect image are superimposed on said display unit, whereby permitting one to find a defect on the MR head, if any.

3. An apparatus for evaluating an MR head as set forth in claim 1 or 2, wherein said radiating beam is directed to the region containing said head element without being focused.

4. An apparatus for evaluating an MR head as set forth in claim 1 or 2, wherein the radiating beam is focused and scanned across the region containing said head element.

5. An apparatus for evaluating an MR head as set forth in claim 1 or 2, wherein a voltage applied to said MR head from said voltage source is so low that the MR head is not destroyed.

6. An apparatus for evaluating an MR head as set forth in claim 1 or 2, wherein said radiating beam is a laser beam.

7. An apparatus for evaluating an MR head as set forth in claim 1 or 2, wherein said radiating beam is an electron beam.

8. An apparatus for evaluating an MR head as set forth in claim 6, wherein said laser beam has a wavelength at which no OBIC (optical beam-induced current) phenomenon can be produced.

9. An apparatus for evaluating an MR head as set forth in claim 6, wherein said laser beam has a wavelength at which an OBIC (optical beam-induced current) phenomenon can be produced.

* * * * *